United States Patent
Orito et al.

(10) Patent No.: US 7,372,347 B2
(45) Date of Patent: May 13, 2008

(54) SURFACE ACOUSTIC WAVE DEVICE

(75) Inventors: Satoshi Orito, Yokohama (JP);
Tsuyoshi Oura, Kawasaki (JP); Toru Takezaki, Yokohama (JP); Satoshi Ichikawa, Otawara (JP); Hirotada Wachi, Yokohama (JP); Toshifumi Tanaka, Otawara (JP); Koichi Wada, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 30 days.

(21) Appl. No.: 10/989,099

(22) Filed: Nov. 16, 2004

(65) Prior Publication Data

US 2005/0168302 A1 Aug. 4, 2005

(30) Foreign Application Priority Data

Nov. 18, 2003 (JP) ............................. 2003-388575

(51) Int. Cl.
*H03H 9/00* (2006.01)
*H03H 9/25* (2006.01)

(52) U.S. Cl. ..................................... 333/193; 333/196

(58) Field of Classification Search ................ 333/193, 333/194, 195, 196; 310/313 B, 313 C
See application file for complete search history.

(56) References Cited

U.S. PATENT DOCUMENTS

| | | | | |
|---|---|---|---|---|
| 3,983,514 | A * | 9/1976 | Coussot | 333/151 |
| 4,375,624 | A * | 3/1983 | DeVries | 333/194 |
| 6,057,630 | A * | 5/2000 | Yanagihara et al. | 310/313 B |
| 6,577,209 | B2 * | 6/2003 | Kobayashi et al. | 333/193 |

FOREIGN PATENT DOCUMENTS

| | | |
|---|---|---|
| JP | 53-114644 | 10/1978 |
| JP | 10-41778 | 2/1998 |
| JP | 10-209802 | 8/1998 |
| JP | 11-205079 | 7/1999 |
| WO | WO 96/10293 | 4/1996 |

* cited by examiner

*Primary Examiner*—Dean Takaoka
(74) *Attorney, Agent, or Firm*—Arent Fox LLP

(57) ABSTRACT

A surface acoustic wave (SAW) device includes a piezoelectric substrate, a first and a second interdigital transducers (IDT) provided thereon. The second IDT has a side that is substantially aligned with a corresponding side of the first IDT, and another side of the second IDT is arranged so that the second IDT may adjust a leaked wave caused resulting from by a power-flow angle of the piezoelectric substrate.

11 Claims, 14 Drawing Sheets

THICK LINE:
THE SECOND EMBODIMENT
THIN LINE:
CONVENTIONAL TECHNIQUE

Fig.15

THICK LINE:
THE SECOND EMBODIMENT
THIN LINE:
THE EIGHTH EMBODIMENT

SURFACE ACOUSTIC WAVE DEVICE

BACKGROUND OF THE INVENTION

1. Field of the Invention

This invention generally relates to a surface acoustic wave device that employs a piezoelectric material, and more particularly, to a surface acoustic wave device having multiple interdigital transducers (hereinafter simply referred to as IDT) on a piezoelectric material substrate (hereinafter simply referred to as piezoelectric substrate).

2. Description of the Related Art

In these years, the above-mentioned type of filter, which is composed of surface acoustic wave (hereinafter referred to as SAW) device having multiple IDTs on the piezoelectric substrate, has been employed for a bandpass filter in a television set having a frequency range of 30 MHz to 400 MHz and an RF filter in a mobile telephone having a frequency range of 800 MHz to several GHz. An IDT includes a pair of comb-like electrodes. Each comb-like electrode is composed of a bus bar and electrode fingers having first edges connected to the bus bar and second edges that are open. A pair of comb-like electrodes is arranged so that the electrode fingers of the comb-like electrodes are alternately crossed or interleaved at regular intervals. In other words, the interleaved electrode fingers are alternately connected to two bus bars. A SAW is generated by applying an alternating voltage across the pair of comb-like electrodes. The SAW has a frequency response by which a filter having a desired frequency characteristic is obtainable.

Figure 1:
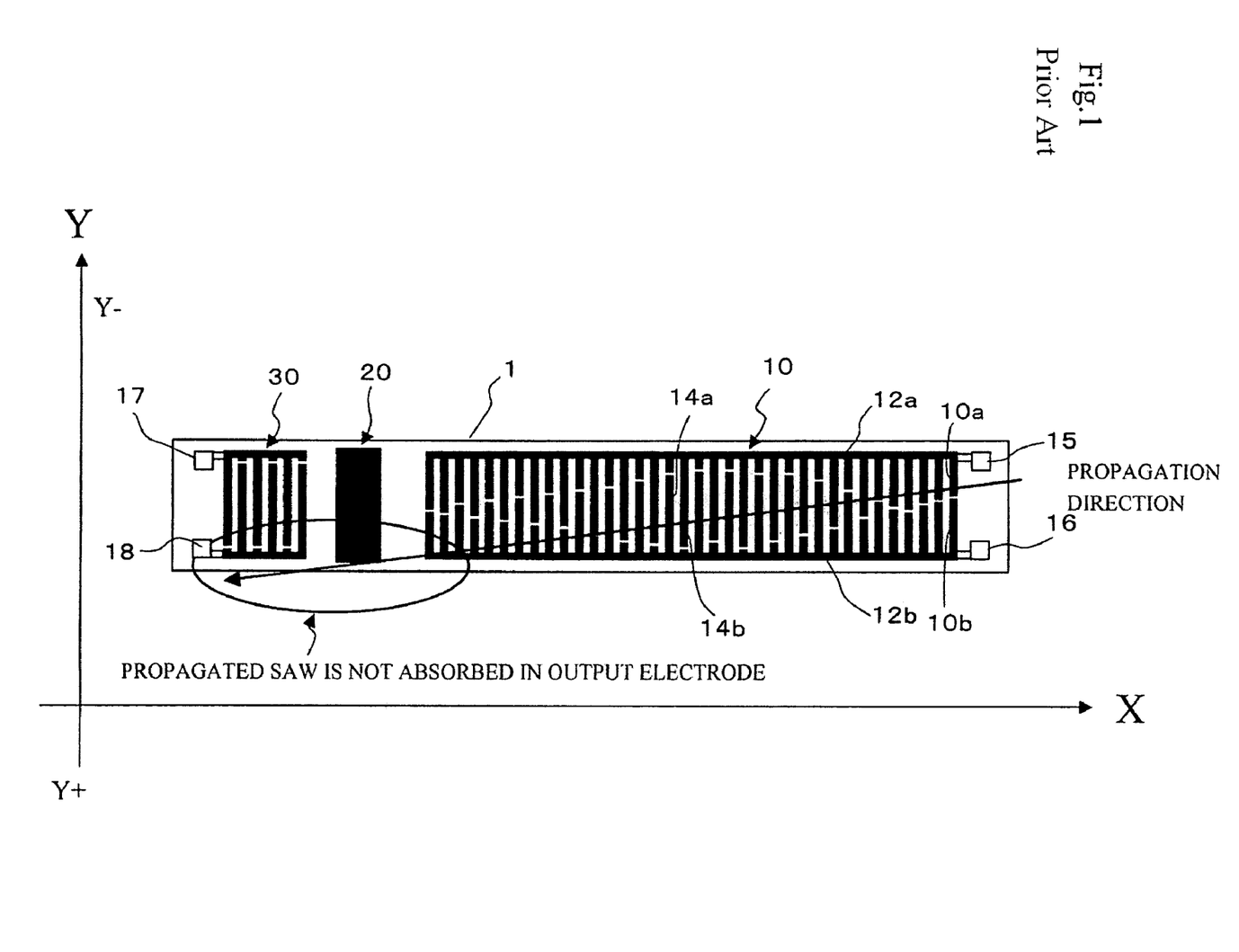
FIG. 1 is a plane view of a conventional SAW device.

FIG. 1 shows a filter with the SAW. Japanese Patent Application Publication No. 10-41778 (hereinafter referred to as Document 1) discloses this type of filter. Referring to FIG. 1, there are arranged a first IDT 10, a ground electrode 20, and a second IDT 30 on a piezoelectric substrate 1. The first IDT 10, the ground electrode 20, and the second IDT 30 are adjacently arranged in a direction of the SAW propagation. The ground electrode 20 is arranged between the first IDT 10 and the second IDT 30, serving as a shield electrode. The first IDT 10 serves as an input electrode (or output electrode) and the second IDT 30 serves as an output electrode (or input electrode). The ground electrode 20 prevents electromagnetic coupling of the IDT 10 and the IDT 30. Also, the ground electrode 20 is arranged on a tilt in order to prevent the SAW that travels from the IDT 10 (or the IDT 30) from being reflected by the ground electrode 20 and returning to the IDT 10 (or the IDT 30).

The IDT 10 includes a pair of comb-like electrode 10a and 10b. The comb-like electrode 10a includes a bus bar 12a and multiple electrode fingers 14a. The comb-like electrode 10b also includes a bus bar 12b and multiple electrode fingers 14b. The open edges of the electrode fingers 14a face those of the electrode fingers 14b, which are referred to as crossing portions or overlapping parts. The crossing portions of the interleaved electrode fingers that face each other are involved in excitation of SAW. As shown in FIG. 1, an electrode finger pattern is weighted. The electrode finger pattern is defined as a pattern formed by the electrode fingers. The electrode finger pattern may be weighted by, for example, apodization. By this apodization, lengths of the electrode fingers in the overlapping parts (hereinafter referred to as aperture length) vary in the propagation direction. The aperture lengths are relatively small in the vicinity of both sides of the IDT 10, which is defined as small overlapping parts. On the other hand, the aperture lengths are relatively large around the center of the IDT 10. The aperture length is proportional to excitation intensity. Therefore, the strong SAWs are generated around the center of the IDT 10, and weak SAWs are generated in the vicinity of both ends of the IDT 10. The frequency characteristic may be altered by changing the weight by apodization.

The IDT 30 also includes a pair of comb-like electrodes. However, the IDT 30 is not weighted, which is different from the IDT 10. In other words, the electrode fingers of the IDT 30 have an identical overlapping length. The above-mentioned IDT is defined as a normal IDT.

The bus bar 12a is connected to an electrode pad 15, and the bus bar 12b is connected to an electrode pad 16. The bus bars of the IDT 30 are respectively connected to electrode pads 17 and 18. Thus, the filter with the above-mentioned configuration serves as a bandpass filter.

With the above-mentioned SAW device, it is necessary to consider a power-flow angle of the piezoelectric substrate 1. The power-flow angle defines the propagation direction of the SAW. As shown in FIG. 1, the power-flow angle is created by an X-axis and the propagation direction of the SAW, where the X-axis is defined as the direction parallel to the central axes of the longer sides of the IDTs 10 and 30, and a Y-axis is defined as the direction perpendicular to the X-axis. The power-flow angle is specific to the piezoelectric materials, and generally ranges from zero to a few degrees. For example, 112° $LiTaO_3$ has the power-flow angle of a few degrees. FIG. 1 shows a case where the power-flow angle of the piezoelectric substrate 1 is not zero. The SAW travels from the IDT 10 at the power-flow angle. Therefore, the IDT 30 is unable to receive the entire SAW. The SAW that is not received by the IDT 30 is defined as leaked wave, which degrades the stopband characteristic.

Figure 2:
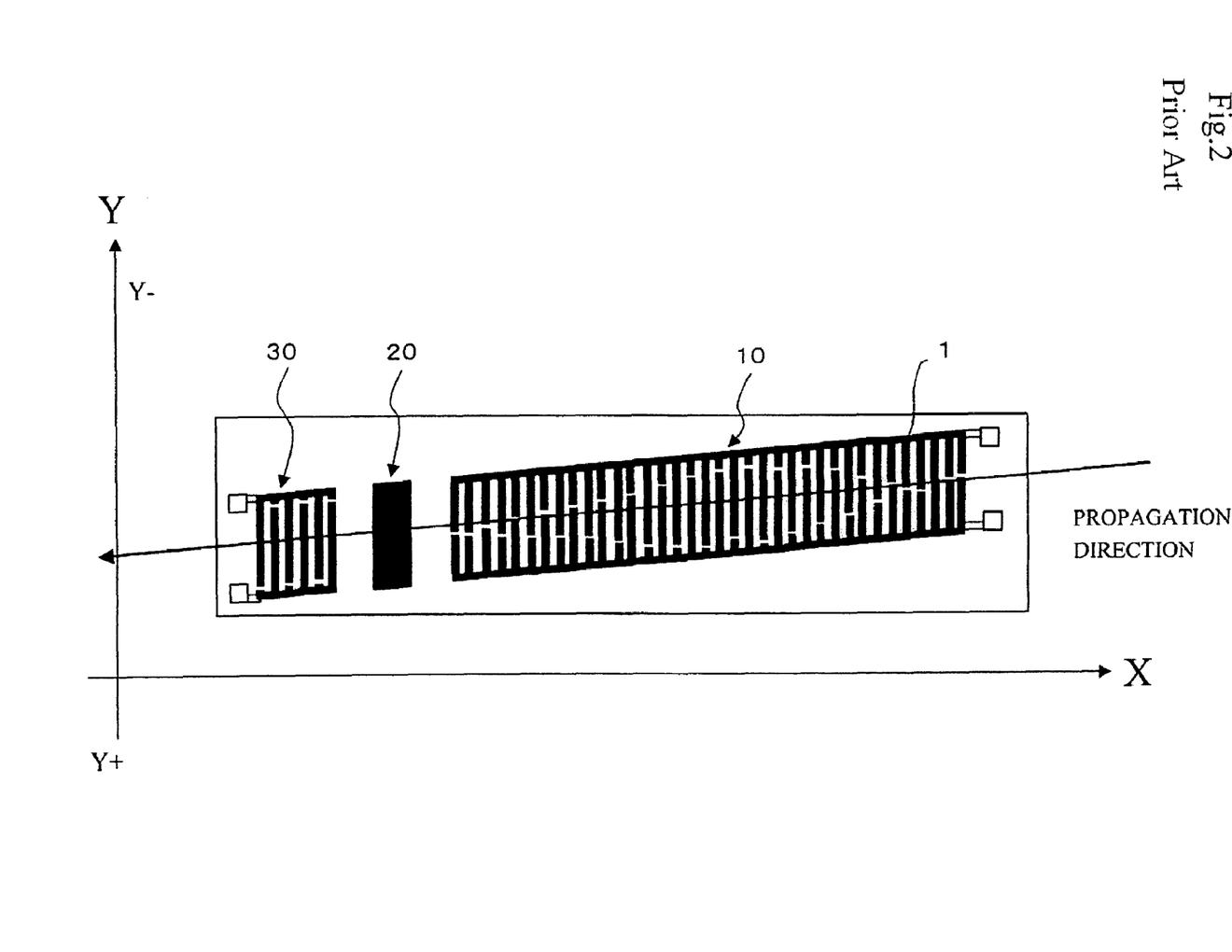
FIG. 2 is a plane view of another conventional SAW device.
Figure 3:
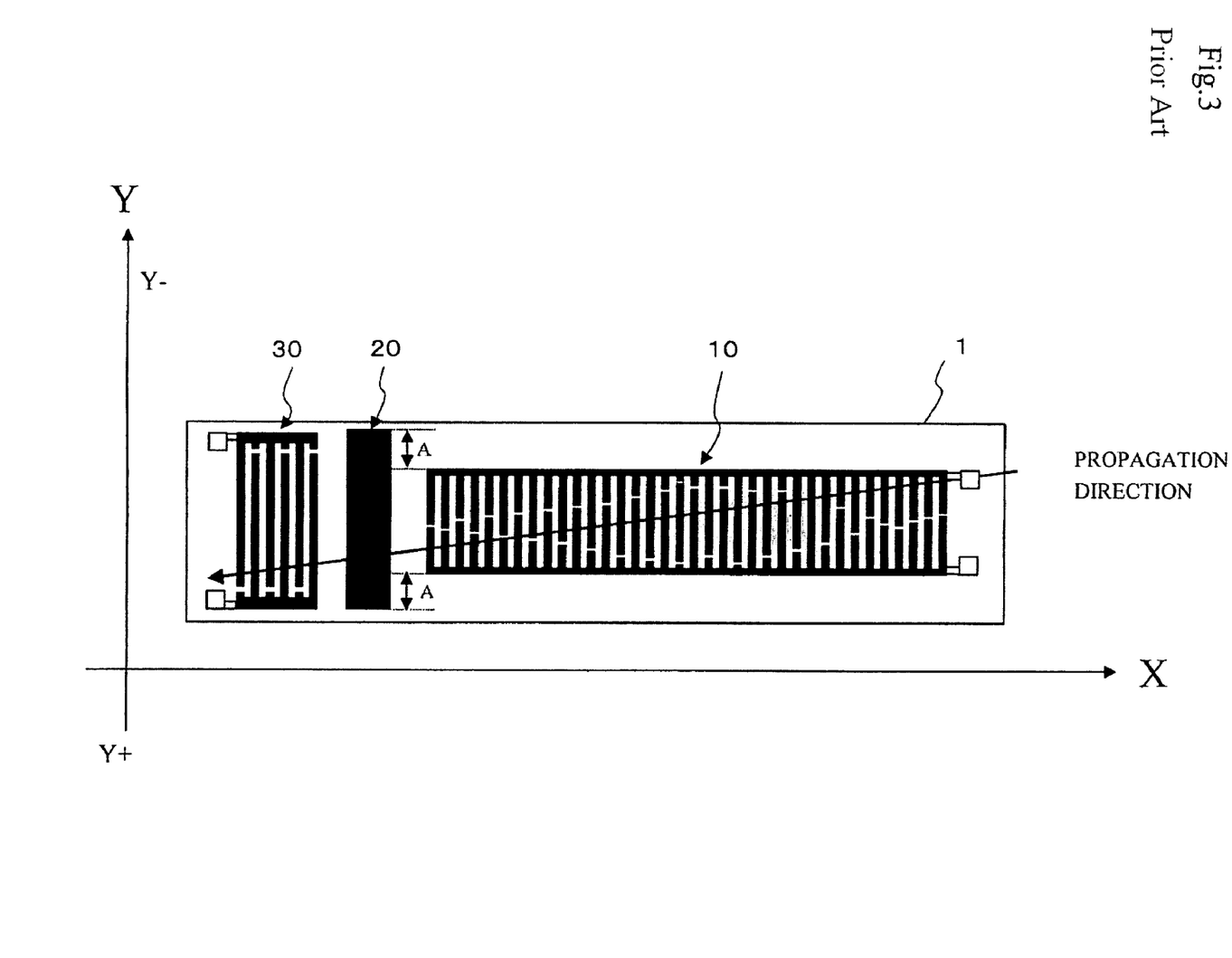
FIG. 3 is a plane view of yet another conventional SAW device.

The above-mentioned drawback has been well known, and some proposals have been made. International Publication Number WO 96/10293 (hereinafter referred to as Document 2), Japanese Patent Application Publication No. 10-209802 (hereinafter referred to as Document 3), and Japanese Patent Application Publication No. 11-205079 (hereinafter referred to as Document 4) have proposed that, in the case where the piezoelectric substrate having a non-zero power-flow angle, the electrodes are arranged so that the propagation direction of the SAW may be parallel to the power-flow angle. This is shown in FIG. 2. In addition, Japanese Patent Application Publication No. 53-114644 (hereinafter referred to as Document 5) has proposed that the aperture length of the output electrode is designed to be greater than that of the input electrode so that the leaked wave caused by the power-flow angle may be adjusted. This is shown in FIG. 3. Referring to FIG. 3, the IDT 30 extends from both sides of the IDT 10, by a width A, in the direction perpendicular to the central axes. Similarly, the ground electrode 20 also extends from both sides of the IDT 10, by the width A, in the direction perpendicular to the central axes. In Document 5, the aperture lengths of the output electrode in the Y direction are 1.05 to 1.50 times those of the input electrode.

However, with the above-mentioned techniques, it is to be noted that a larger piezoelectric substrate is required to arrange the IDT 10 on a tilt as disclosed in Documents 2, 3, and 4, or to arrange the IDT 30 and the ground electrode 20 having larger aperture lengths as disclosed in Document 5. The above-mentioned techniques cause a problem that the SAW device cannot be downsized. In particular, if the aperture lengths are made relatively large as disclosed in Document 5, the aperture lengths become larger than necessary, and the electrode finger resistance is increased. This may increase losses.

SUMMARY OF THE INVENTION

The present invention has been made in view of the above circumstances and provides a small-sized and low-loss SAW device that is excellent in stopband characteristics.

According to an aspect of the present invention, there is provided a surface acoustic wave (SAW) device including a piezoelectric substrate, a first interdigital transducer (IDT) and a second IDT provided on the piezoelectric substrate. One side of the second IDT and its corresponding side of the first IDT are arranged in almost a line, and another side of the second IDT is arranged so that the second IDT may adjust a leaked wave caused resulting from by a power-flow angle of the piezoelectric substrate. The substrate can be downsized by arranging one side of the second IDT and its corresponding side of the first IDT. In addition, the second IDT has appropriate aperture lengths, which is low in losses. Excellent stopband characteristic is obtainable by arranging another side of the second IDT so that the second IDT may adjust a leaked wave caused resulting from by a power-flow angle of the piezoelectric substrate.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 4:
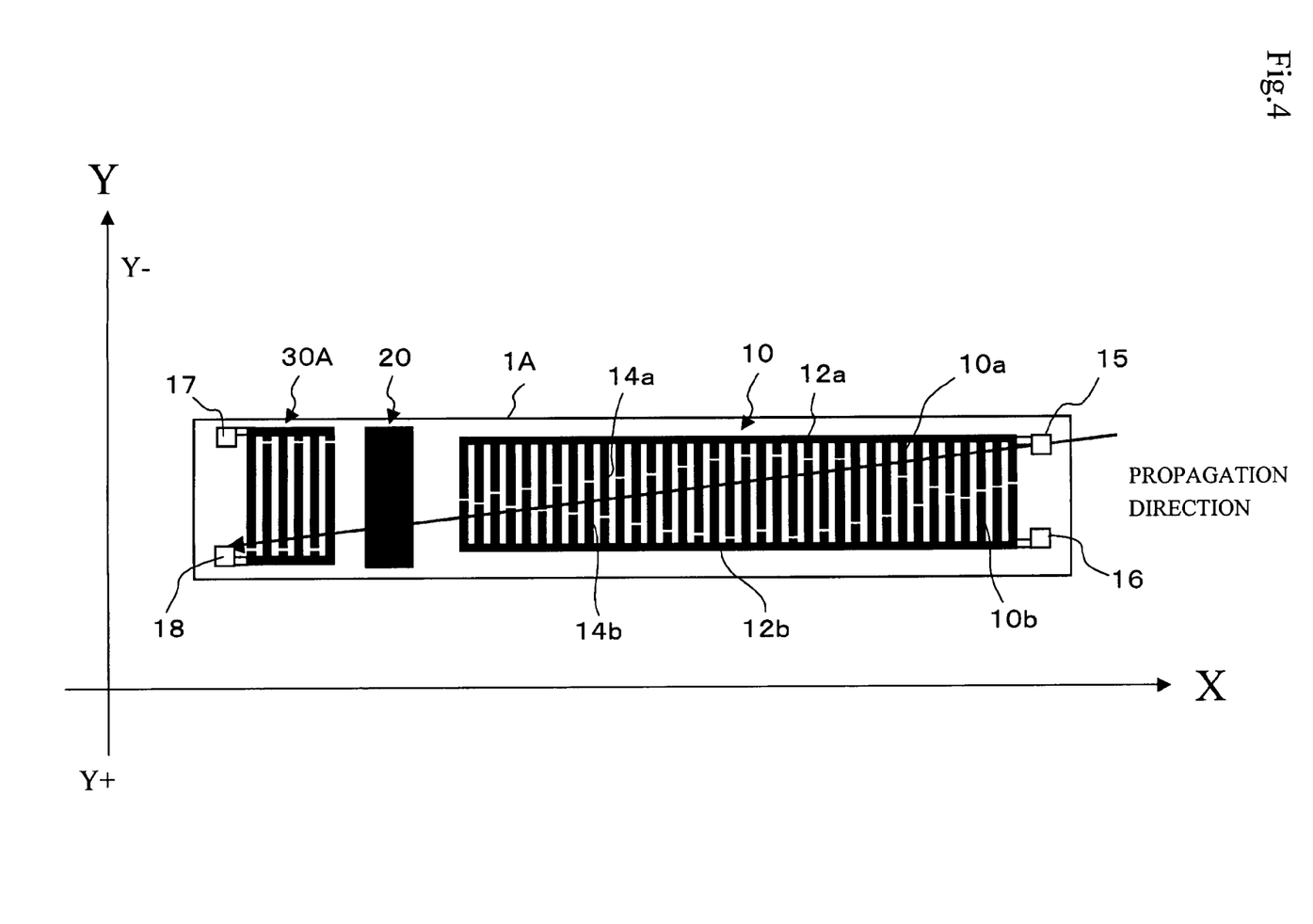
FIG. 4 is a plane view of the SAW device in accordance with a first embodiment of the present invention.

A description will be given of a first embodiment of the present invention with reference to drawings. FIG. 4 is a diagram showing a SAW device in accordance with the first embodiment of the present invention. The same components and configurations as those that have been described above have the same reference numerals. Referring to FIG. 4, the SAW device includes a piezoelectric substrate 1A, an IDT 10 that is weighted by apodization, a ground electrode 20, and an IDT 30A. The IDT 30A has a side (upper side) that is close to an imaginary straight line that extends from a corresponding side (upper side) of the IDT 10. As shown in FIG. 4, the upper side of the IDT 10 is further in than that of the IDT 30A and is further set back from the longitudinal edge of the substrate 1A. The leaked wave at the power-flow angle does not travel to the upper side of the IDT 30A, and it is unnecessary to extend the upper side of the IDT 30A towards the longitudinal edge of the piezoelectric substrate 1A. This arrangement of the IDT 30A differs from the IDT 30 in FIG. 3. In contrast, the other side of the IDT 30A is arranged so that the IDT 30A may adjust the leaked wave caused by the power-flow angle. That is, the IDT 30A extends in the direction perpendicular to the central axis of the SAW device and on the side that the leaked wave travels, namely, Y+ direction. The IDT 30A thus arranged is capable of receiving the entire SAW that travels from the IDT 10 at the power-flow angle, and the excellent stopband characteristic is obtainable. In addition, the IDT 30A in FIG. 4 is smaller than the IDT 30 in FIG. 3. This makes it possible to make the piezoelectric substrate 1A in FIG. 4 smaller than the piezoelectric substrate 1 in FIG. 3, and thereby to realize the downsized SAW device.

Second Embodiment

Figure 5:
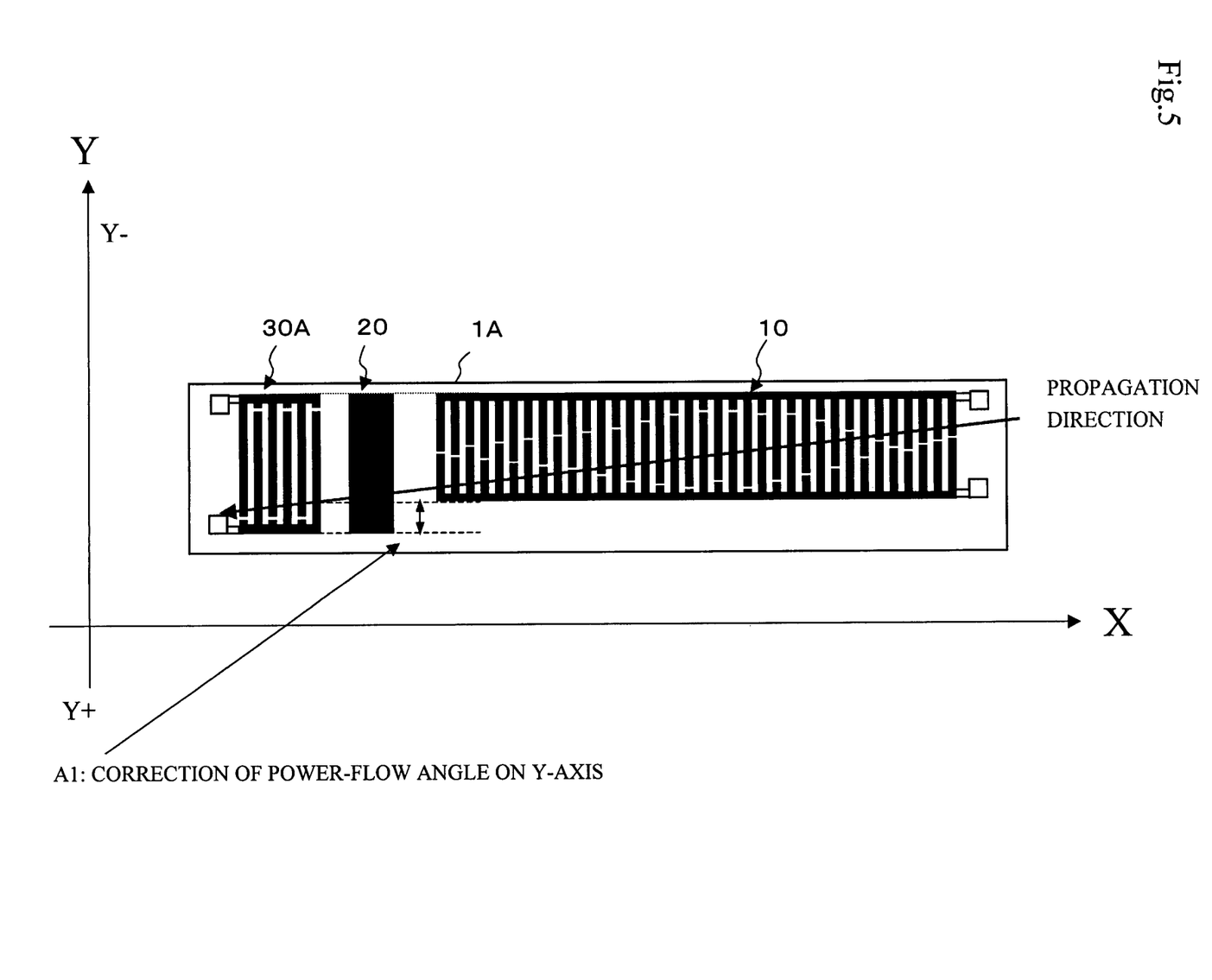
FIG. 5 is a plane view of the SAW device in accordance with a second embodiment of the present invention.

FIG. 5 is a diagram showing a SAW device in accordance with a second embodiment of the present invention. The IDT 30A has a side (upper side) that is aligned with a corresponding side (upper side) of the IDT 10. In other words, one side (upper side) of the IDT 30A and its corresponding side of the IDT 10 are identically located on the Y-axis. The other side of the IDT 30A extends beyond its corresponding side of the IDT 10, by the width A1, in the Y+ direction. The width A1 is provided for adjusting the leaked SAW. The IDT 30A thus arranged is capable of receiving the entire SAW that travels at the power-flow angle from the IDT 10, and the excellent stopband characteristic is obtainable. The IDT 30A in FIG. 5 is smaller than the IDT 30 in FIG. 3. This makes it possible to make the piezoelectric substrate 1A in FIG. 5 smaller than the piezoelectric substrate 1 in FIG. 3, and thereby to realize the downsized SAW device.

Figure 6A:
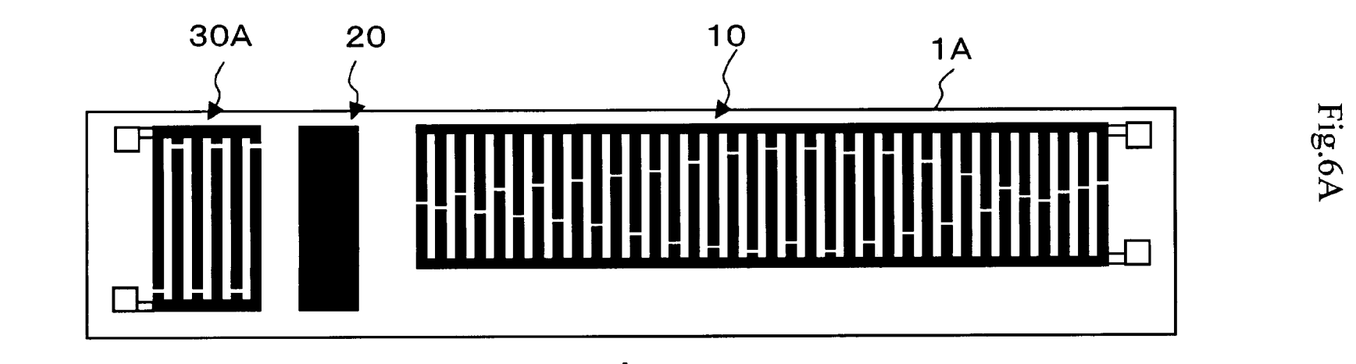
FIG. 6 illustrates a simple electrode pattern.
Figure 6B:
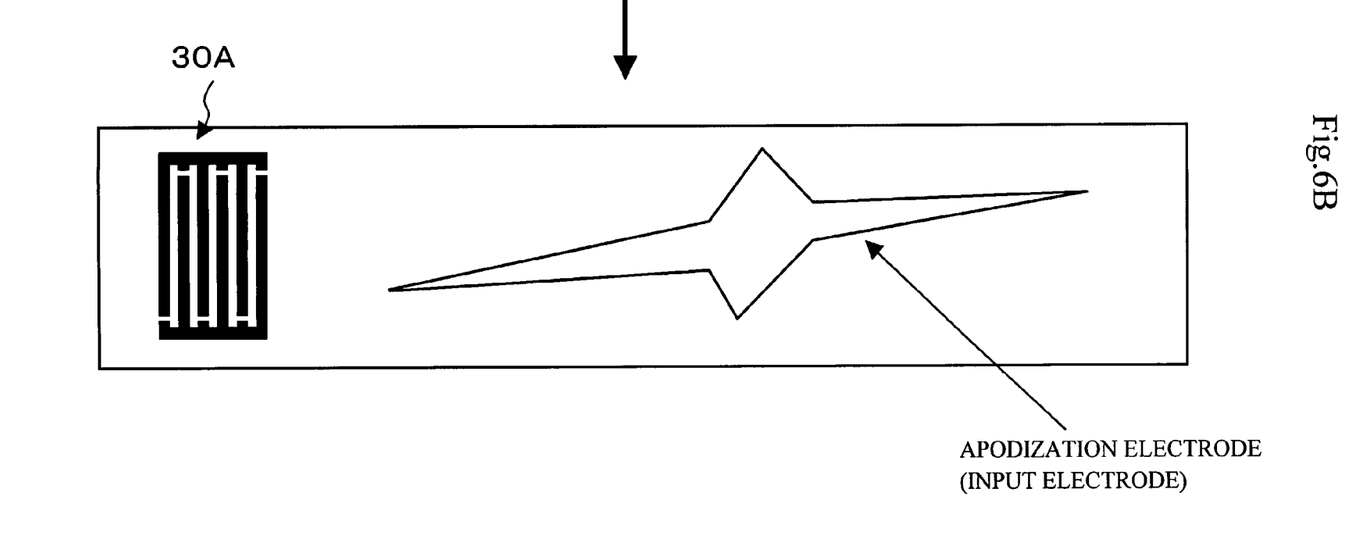

Here, for convenience of explanation, referring to FIGS. 6A and 6B, the IDT 10 that is weighted by apodization is described. FIG. 6A is a pattern showing sizes of the aperture lengths and positions. The aperture lengths (lengths of the interleaved electrode fingers in the overlapping parts or the crossing portions) of this pattern are very small or zero at and around both ends. A tilt line is defined as a line connecting both ends of this pattern. Therefore, the tilt line represents an angle defined by apodization weighting. Referring to FIG. 6B, generally, the weight by apodization is very small or zero at and around both ends of the IDT 10.

Third Embodiment

Figure 7:
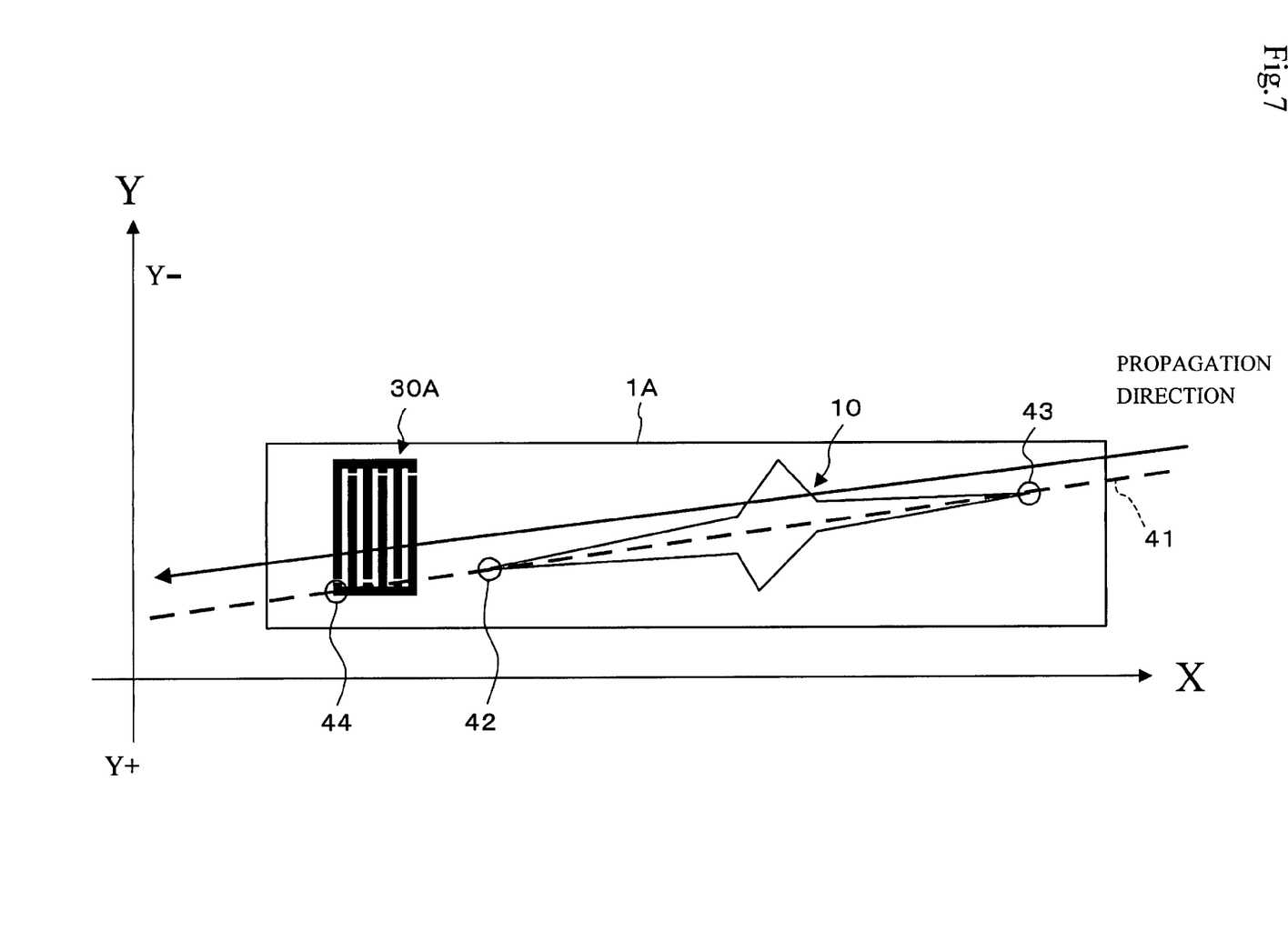
FIG. 7 is a plane view of the SAW device in accordance with a third embodiment of the present invention.

FIG. 7 is a diagram showing a SAW device in accordance with a third embodiment of the present invention. An edge 44 is a part of an electrode finger of the IDT 30A, and is arranged the farthest from the IDT 10. The edge 44 is also arranged on an imaginary extended line of a tilt line 41 of the IDT 10. The IDT 30A thus arranged is capable of receiving the entire SAW that travels from the IDT 10 at the power-flow angle, and the excellent stopband characteristic is obtainable. The IDT 30A in FIG. 7 is smaller than the IDT 30 in FIG. 3. This makes it possible to make the piezoelectric substrate 1A in FIG. 7 smaller than the piezoelectric substrate 1 in FIG. 3, and thereby to realize the downsized SAW device.

Fourth Embodiment

Figure 8:
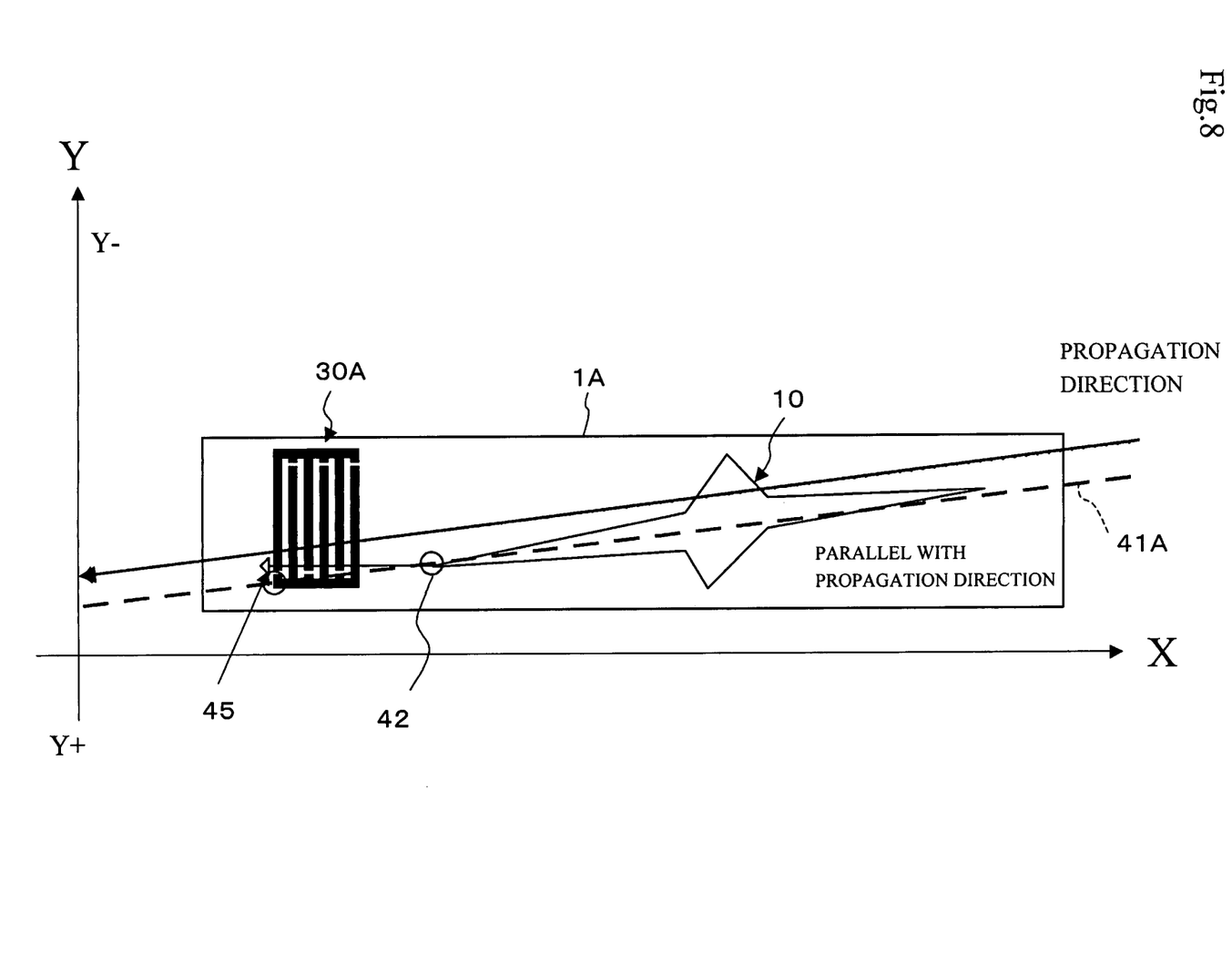
FIG. 8 is a plane view of the SAW device in accordance with a fourth embodiment of the present invention.

FIG. 8 is a diagram showing a SAW device in accordance with a fourth embodiment of the present invention. An edge of an electrode finger of the IDT 30A that is the farthest from the IDT 10 is arranged offset to the Y+ direction by the power-flow angle, from an electrode finger of the IDT 10 that is the closest to the IDT 30A, that is, from a position 42 that has a small or zero weight by apodization. The IDT 30A thus arranged has an extended portion 45 in the Y+ direction on the basis of the position 42. The extended portion 45 is capable of receiving the leaked wave, and the excellent stopband characteristic is obtainable. The IDT 30A in FIG. 8 is smaller than the IDT 30 in FIG. 3. This makes it possible to make the piezoelectric substrate 1A in FIG. 8 smaller than the piezoelectric substrate 1 in FIG. 3 and thereby to realize the downsized SAW device. As shown in FIG. 8, the SAW has a propagation direction parallel to a line 41A that connects the position 42 and the edge of the electrode finger that is the farthest from the IDT 10.

Fifth Embodiment

Figure 9:
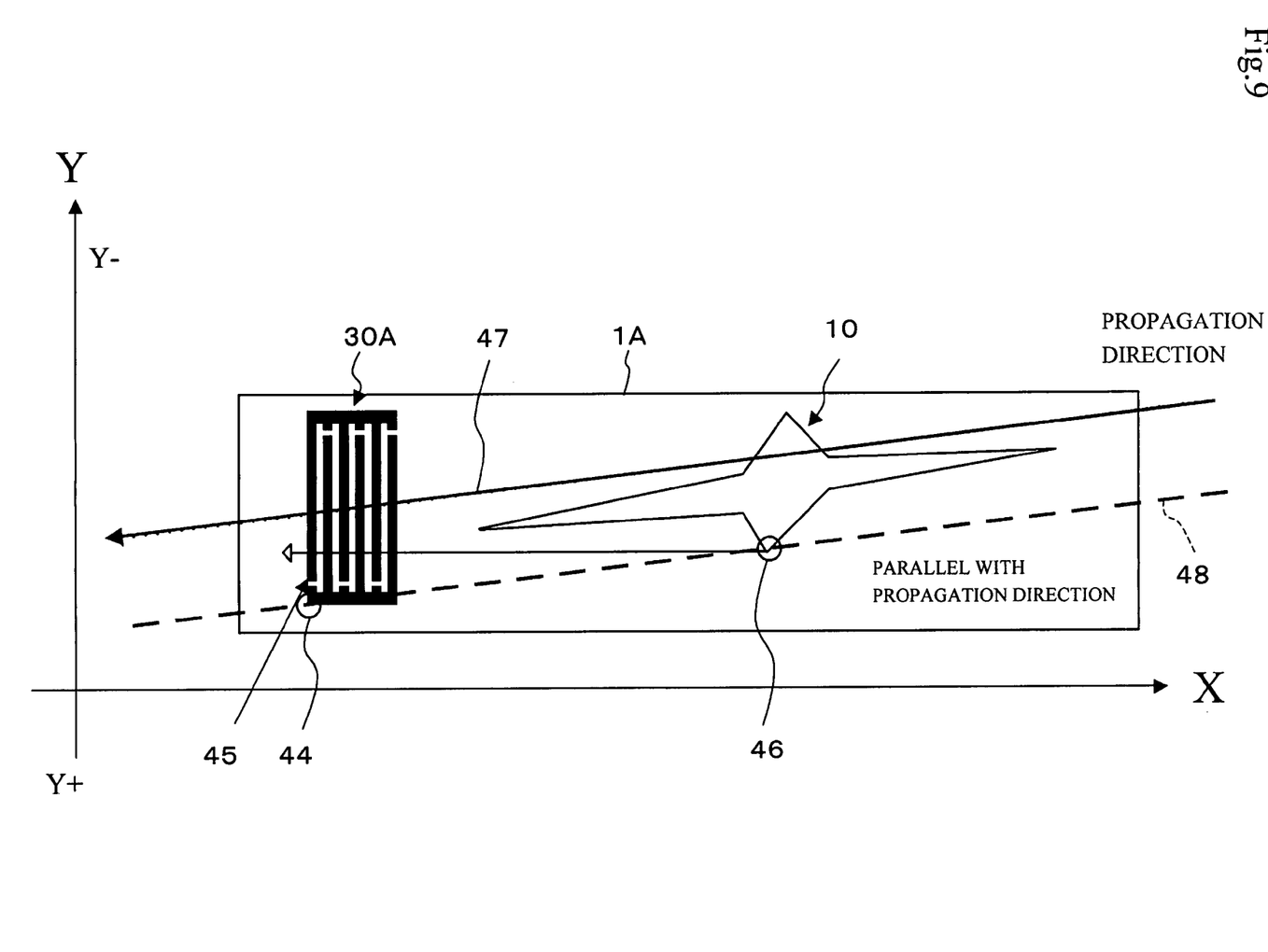
FIG. 9 is a plane view of the SAW device in accordance with a fifth embodiment of the present invention.

FIG. 9 is a diagram showing a SAW device in accordance with a fifth embodiment of the present invention. The edge 44 of an electrode finger of the IDT 30A, which is the farthest from the IDT 10, is arranged on an imaginary extended line of a straight line 48. The edge 44 of the electrode finger is included in a very small or zero aperture length in the IDT 30A. The straight line 48 passes through an edge 46 of an electrode finger that forms the largest aperture of the IDT 10 and is arranged in parallel with a propagation direction 47 at the power-flow angle. Thus, the IDT 30A has an extended portion in the Y+ direction. The above-mentioned extended portion is capable of receiving the leaked wave, and the excellent stopband characteristic is obtainable. The IDT 30A in FIG. 9 is smaller than the IDT 30 in FIG. 3. This makes it possible to make the piezoelectric substrate 1A in FIG. 9 smaller than the piezoelectric substrate 1 in FIG. 3 and thereby to realize the downsized SAW device. As shown in FIG. 9, the SAW has the propagation direction almost parallel to the line 48.

Sixth Embodiment

Figure 10:
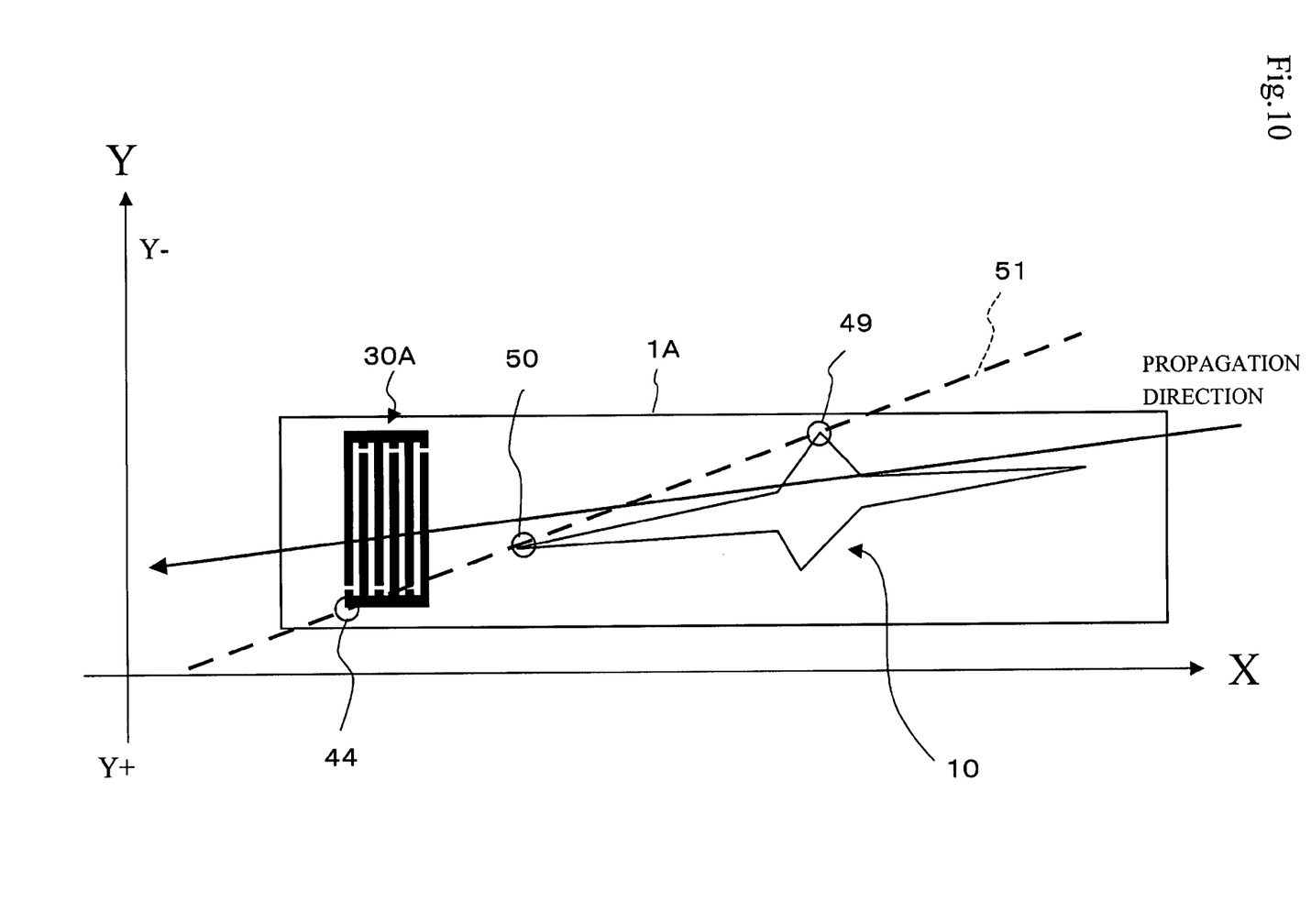
FIG. 10 is a plane view of the SAW device in accordance with a sixth embodiment of the present invention.

FIG. 10 is a diagram showing a SAW device in accordance with a sixth embodiment of the present invention. The edge 44 of the electrode finger of the IDT 30A, which is the farthest from the IDT 10, is arranged on an imaginary extended line 51 of a straight line connecting an edge 49 and an edge 50. The edge 49 forms the largest aperture of the IDT 10. The edge 50 of the electrode finger is the closest to the IDT 30A. As shown in FIG. 10, a tilt of the straight line 51 is bigger than the power-flow angle. The IDT 30A has an extended portion in the Y+ direction, and is certainly capable of receiving the leaked wave, and the excellent stopband characteristic is obtainable. The IDT 30A in FIG. 10 is smaller than the IDT 30 in FIG. 3. This makes it possible to make the piezoelectric substrate 1A in FIG. 10 smaller than the piezoelectric substrate 1 in FIG. 3 and thereby to realize the downsized SAW device.

Seventh Embodiment

Figure 11:
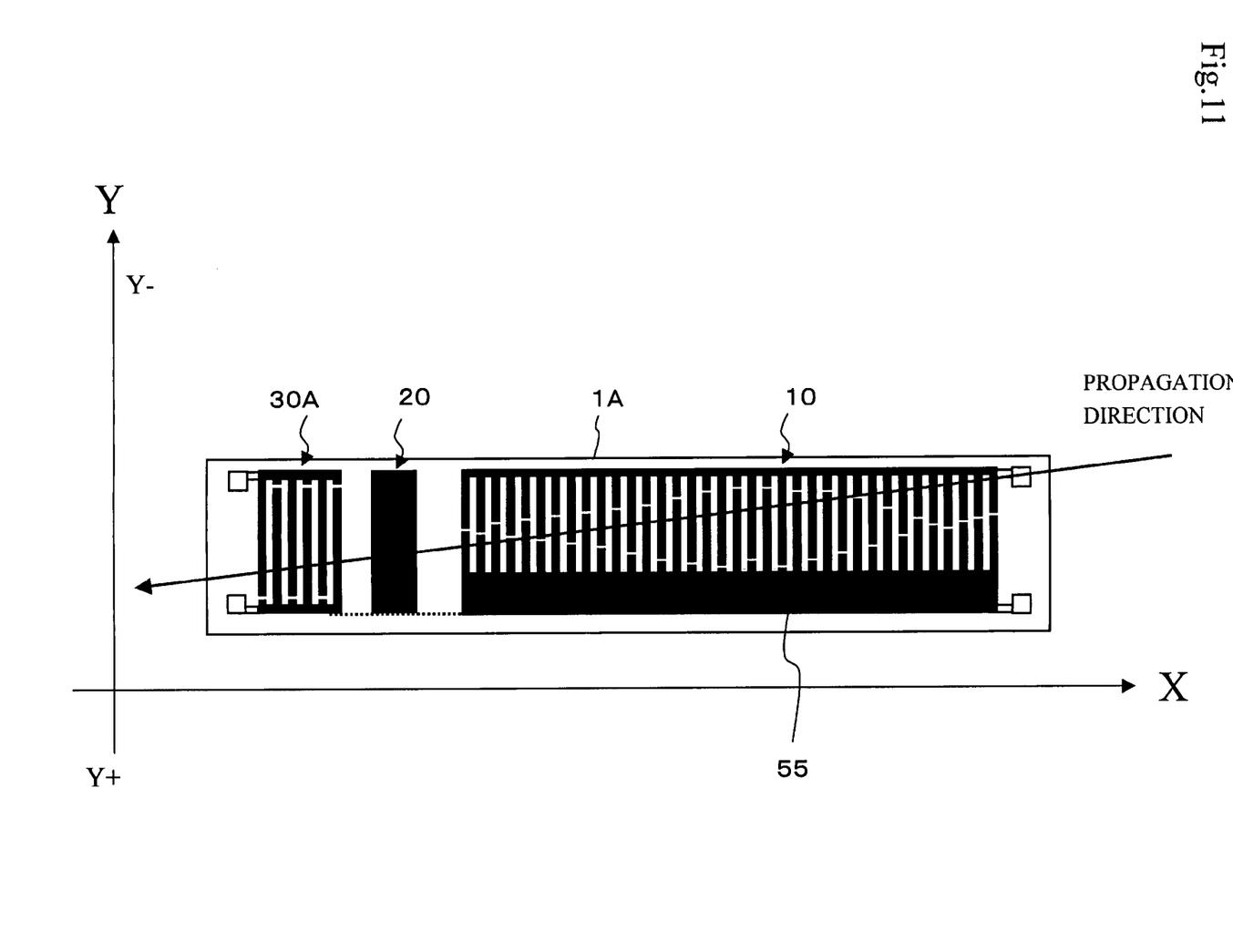
FIG. 11 is a plane view of the SAW device in accordance with a seventh embodiment of the present invention.

FIG. 11 is a diagram showing a SAW device in accordance with a seventh embodiment of the present invention. A solid pattern 55 is added to the IDT 10 in FIG. 5. The solid pattern 55 is arranged to continue from one bus bar of the IDT 10, which are the lower bus bar in FIG. 11 and the bus bar 12b in FIG. 1. The width in the Y+ direction is equal to A1 in FIG. 5. One side of the solid pattern 55 and its corresponding side of the IDT 30A are arranged on a straight line. In other words, one side of the solid pattern 55 and its corresponding side of the IDT 30A have identical positions on a Y-axis. The entire width of the IDT 10 including the solid pattern 55 in the Y-axis direction is almost equal to that of the IDT 30 in the Y-axis direction.

Eighth Embodiment

Figure 12:
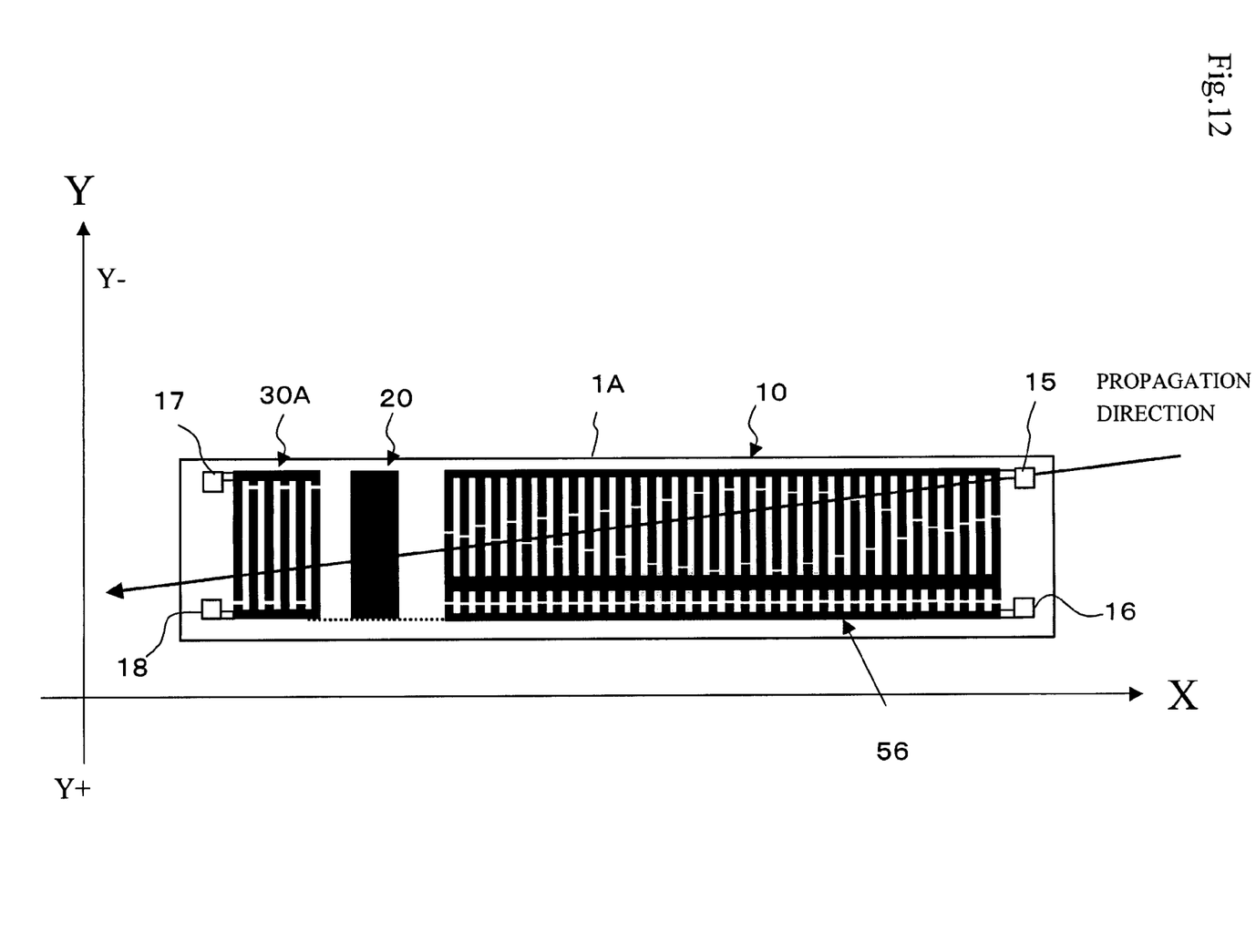
FIG. 12 is a plane view of the SAW device in accordance with an eighth embodiment of the present invention.

FIG. 12 is a diagram showing a SAW device in accordance with an eighth embodiment of the present invention. A dummy electrode 56 is arranged instead of the solid pattern 55 in FIG. 11. The adjacent electrode fingers are not overlapped in the dummy electrode, which does not excite the SAW. The same voltage is applied to pads 15 and 16, and the ground potential is applied to the bus bar that is commonly connected from the IDT 10 and the dummy electrode 56 so that the dummy electrode 56 may cancel undesired waves generated on the IDT 10. The undesired waves are particularly generated in small overlapping parts. The electrode finger pattern of the dummy electrode 56 is not limited to that shown in FIG. 12. Some electrode fingers of the dummy electrode 56 may form the small overlapping part.

Ninth Embodiment

Figure 13:
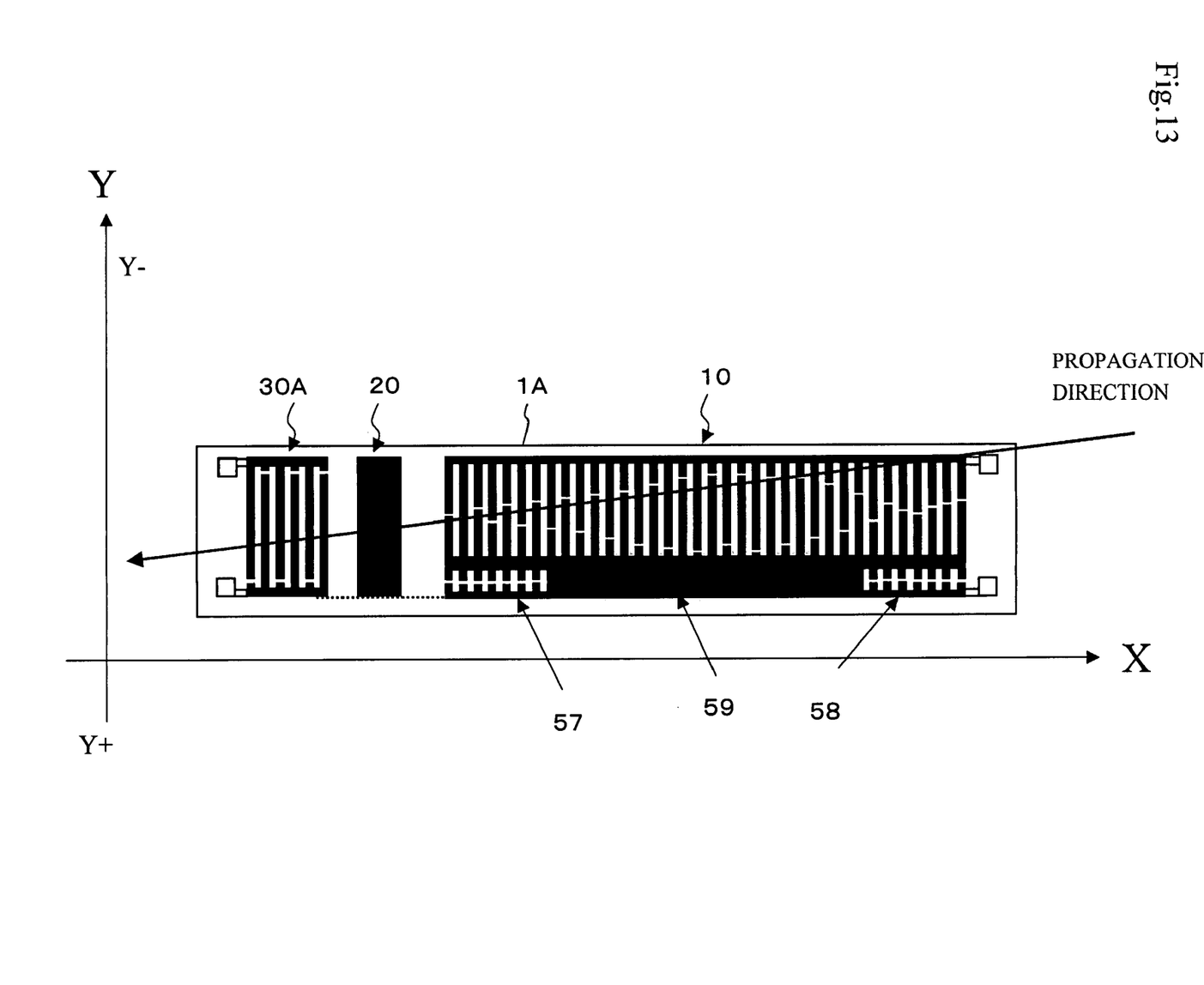
FIG. 13 is a plane view of the SAW device in accordance with a ninth embodiment of the present invention.

FIG. 13 is a diagram showing a SAW device in accordance with a ninth embodiment of the present invention. Referring to FIG. 13, the solid pattern 55 in FIG. 11 and the dummy electrode 56 in FIG. 12 are both added. Dummy electrodes 57 and 58 are arranged in the propagation direction of one side of the IDT 10. A solid pattern 59 is arranged around the center of the IDT 10. Both sides of the propagation direction of the IDT 10 are small overlapping parts. Therefore, the dummy electrodes 57 and 58 are provided to cancel the undesired waves.

Referring back to FIG. 5, the patterns that can be formed in the lower part of the IDT 10 are not limited to the seventh through ninth embodiments of the present invention. Any other pattern may be formed.

Figure 14:
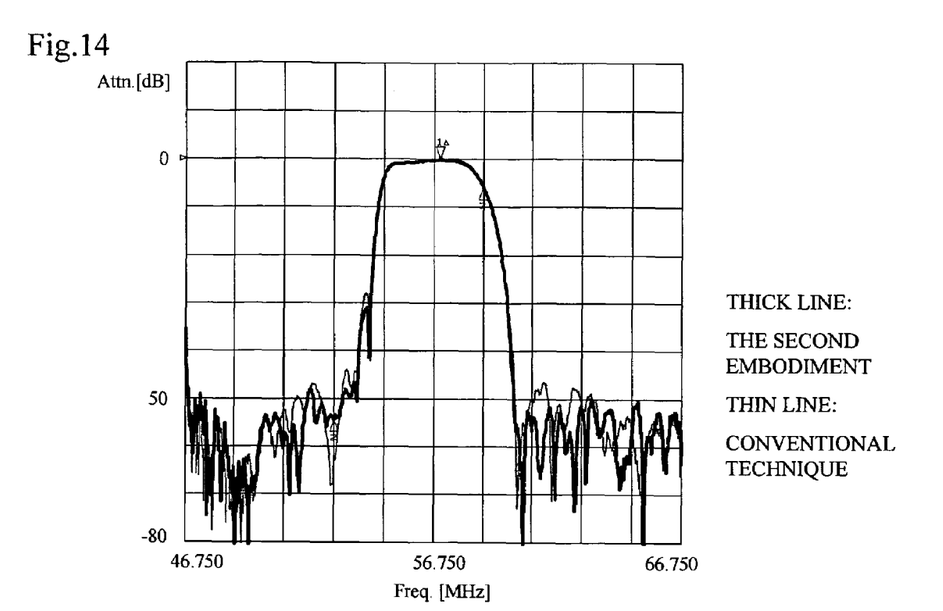
FIG. 14 is a graph showing frequency characteristic of the conventional SAW device and the SAW device in accordance with the second embodiment of the present invention.

FIG. 14 is a graph describing the frequency characteristic of the second embodiment of the present invention as shown in FIG. 5 (solid line) and that of the conventional SAW device as shown in FIG. 1 (thin line). The horizontal axis denotes frequency (MHz), and the vertical axis denotes attenuation (dB). As shown in FIG. 14, the stopband frequency characteristic has been improved in the second embodiment of the present invention. In other embodiments of the present invention, the same frequency characteristic is obtainable.

Figure 15:
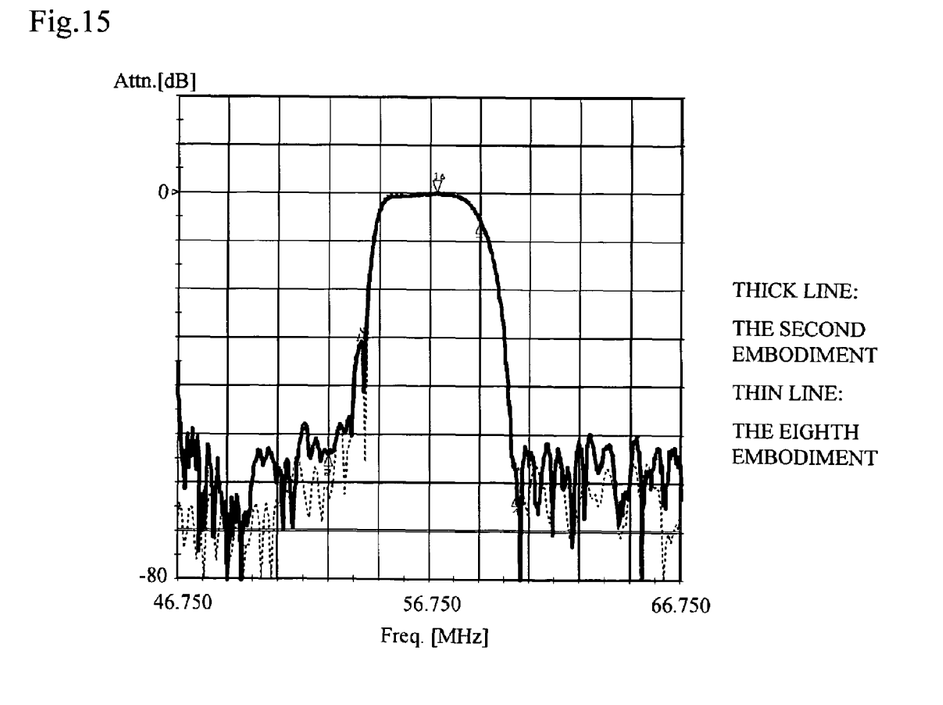
FIG. 15 is a graph showing frequency characteristic of the SAW device in accordance with the second embodiment of the present invention and the SAW device in accordance with the eighth embodiment.

FIG. 15 is a graph describing the frequency characteristic of the eighth embodiment of the present invention as shown in FIG. 12 (thin line) and that of the second embodiment of the present invention as shown in FIG. 5 (solid line). The horizontal axis denotes frequency (MHz), and the vertical axis denotes attenuation (dB). The dummy electrode 56 in accordance with the eighth embodiment of the present invention is capable of canceling the undesired waves generated on the IDT 10. Therefore, suppression in the stopband has been improved more than that of the second embodiment of the present invention.

The present invention is not limited to the above-mentioned first embodiment, and other embodiments, variations and modifications may be made without departing from the scope of the present invention.

The present invention is based on Japanese Patent Application No. 2003-388575 filed on Nov. 18, 2003, the entire disclosure of which is hereby incorporated by reference.

What is claimed is:

1. A surface acoustic wave (SAW) device comprising:
a piezoelectric substrate;
an input interdigital transducer (IDT) and an output IDT provided on the piezoelectric substrate;
wherein:
the input IDT includes a weighted electrode finger pattern to which a dummy electrode is coupled;
the output IDT has a side that is aligned with an identical side of the input IDT in a direction in which bus bars of the input and output IDTs run, a surface acoustic wave being propagated at a power flow angle of the piezoelectric substrate; and
another side of the output IDT is arranged so that the output IDT may receive and adjust a leaked wave propagated from the input IDT at the power-flow angle of the piezoelectric substrate.

2. The SAW device as claimed in claim 1, wherein the output IDT extends beyond the input IDT, to receive the leaked wave, in a direction perpendicular to a central axis of the SAW device and on a propagation side of the leaked wave.

3. The SAW device as claimed in claim 2, wherein the output IDT extends beyond the input IDT by a length for adjusting the leaked wave due to the power-flow angle.

4. The SAW device as claimed in claim 1, wherein:
an edge of an electrode finger of the output IDT that is the farthest from the input IDT is arranged on an imaginary extension of a tilt line of the weighted electrode finger pattern of the input IDT.

5. The SAW device as claimed in claim 1, wherein an edge of an electrode finger of the output IDT that is the farthest from the input IDT is arranged offset to a side that the leaked wave travels, by the power-flow angle, from an electrode finger of the input IDT that is closest to the output IDT.

6. The SAW device as claimed in claim 1, wherein:
the input IDT includes a weighted finger electrode pattern; and
an edge of an electrode finger of the output IDT that is the farthest from the input IDT is located on an imaginary extended line, which passes through another edge of another electrode finger that form a largest aperture in the input IDT and is parallel to a propagation direction of the power-flow angle.

7. The SAW device as claimed in claim 1, wherein:
the input IDT includes a weighted finger electrode pattern; and
an edge of an electrode finger of the output IDT that is the farthest from the input IDT is located on an imaginary extended line connecting an edge of an electrode finger that forms a largest aperture in the input IDT and another edge of the electrode finger in the input IDT that is the closest to the output IDT.

8. The SAW device as claimed in claim 1, further comprising a solid pattern that continues from one side of the input IDT,
wherein the input IDT including the solid pattern has a width substantially equal to that of the output IDT.

9. The SAW device as claimed in claim 1, further comprising a dummy electrode,
wherein the input IDT including the dummy electrode has a width substantially equal to that of the output IDT.

10. The SAW device as claimed in claim 1, wherein the input IDT further includes a solid pattern, and the input IDT including the solid pattern and the dummy electrode has a width substantially equal to that of the output IDT.

11. A surface acoustic wave device comprising:
a piezoelectric substrate;
an input interdigital transducer (IDT) and an output IDT provided on the piezoelectric substrate;
wherein:
the input IDT includes a weighted electrode finger pattern;
the output IDT has a side that is aligned with an identical side of the input IDT in a direction in which bus bars of the input and output IDTs run, a surface acoustic wave being propagated at a power-flow angle of the piezoelectric substrate; and
another side of the output IDT is arranged so that the output IDT may receive and adjust a leaked wave propagated from the input IDT at the power-flow angle of the piezoelectric substrate.

* * * * *